US007241556B1

(12) United States Patent
Saraiya et al.

(10) Patent No.: US 7,241,556 B1
(45) Date of Patent: Jul. 10, 2007

(54) MULTILAYER IMAGEABLE ELEMENT CONTAINING SULFONAMIDO RESIN

(75) Inventors: Shashikant Saraiya, Fort Collins, CO (US); Anthony P. Kitson, Evans, CO (US); Frederic E. Mikell, Greeley, CO (US); Larisa Novoselova, Aurora, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/551,753

(22) Filed: Oct. 23, 2006

Related U.S. Application Data

(63) Continuation of application No. 11/337,778, filed on Jan. 23, 2006, now Pat. No. 7,163,770.

(51) Int. Cl.
*G03F 7/30* (2006.01)
*G03F 7/11* (2006.01)
*G03F 7/039* (2006.01)

(52) U.S. Cl. .................. 430/271.1; 430/302; 430/326; 430/905; 430/910; 430/964

(58) Field of Classification Search ............ 430/271.1, 430/302, 326, 905, 15, 910, 964
See application file for complete search history.

(56) References Cited

U.S. PATENT DOCUMENTS 6,143,464 A 11/2000 Kawauchi
6,152,036 A 11/2000 Verschueren et al.
6,969,570 B1 11/2005 Kitson
7,160,653 B1 * 1/2007 Huang et al. ................ 430/15
2002/0081522 A1 6/2002 Mayake et al.
2004/0067432 A1 4/2004 Kitson et al.
2004/0137366 A1 7/2004 Kawauchi et al.
2005/0037280 A1 2/2005 Loccufier et al.

FOREIGN PATENT DOCUMENTS

JP 2000-330265 3/2002

OTHER PUBLICATIONS

U.S. Appl. No. 11/257,864, filed Oct. 25, 2005, titled “Multilayer Imageable Element Containing Epoxy Resin” by J. Huang, S. Saraiya, K. Ray, A. Kitson, E. Sheriff & A. Krebs.

* cited by examiner

*Primary Examiner*—Richard Schilling
(74) *Attorney, Agent, or Firm*—J. Lanny Tucker

(57) ABSTRACT

A positive-working imageable element comprises inner and outer layers and a radiation absorbing compound such as an IR absorbing dye. The inner layer includes a first polymeric material. The ink receptive outer layer includes a second polymeric binder comprising a polymer backbone and an —X—C(=T)—NR—S(=O)$_2$— moiety that is attached to the polymer backbone, wherein —X— is an oxy or —NR'— group, T is O or S, R and R' are independently hydrogen, halo, or an alkyl group having 1 to 6 carbon atoms. After thermal imaging, the element can be developed using an alkaline developer. Use of the particular second polymeric binder reduces sludging in the developer. Its dissolution rate in the developer is slow enough to resist developer attack in the non-imaged areas of the outer layer but rapid enough for the second polymeric binder to be quickly loosened from imaged areas and kept suspended or dissolved for a considerable time.

19 Claims, No Drawings

MULTILAYER IMAGEABLE ELEMENT CONTAINING SULFONAMIDO RESIN

CROSS-REFERENCE TO RELATED APPLICATIONS

This is a continuation of application Ser. No. 11/337,778, filed Jan. 23, 2006 now U.S. Pat. No. 7,163,770, titled MULTILAYER IMAGEABLE ELEMENT CONTAINING SULFONAMIDO RESIN, now allowed.

FIELD OF THE INVENTION

This invention relates to positive-working imageable elements having improved "clean" processing, that is, elements processable using cleaner processing solutions. It also relates to a method of forming imaged elements from such imageable elements using thermal imaging means.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise an imageable layer applied over the hydrophilic surface of a substrate. The imageable layer includes one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Imaging of the imageable element with ultraviolet and/or visible radiation is typically carried out through a mask that has clear and opaque regions. Imaging takes place in the regions under the clear regions of the mask but does not occur in the regions under the opaque mask regions. If corrections are needed in the final image, a new mask must be made. This is a time-consuming process. In addition, dimensions of the mask may change slightly due to changes in temperature and humidity. Thus, the same mask, when used at different times or in different environments, may give different results and could cause registration problems.

Direct digital imaging has obviated the need for imaging through a mask and is becoming increasingly important in the printing industry. Imageable elements for the preparation of lithographic printing plates have been developed for use with infrared lasers. Thermally imageable, multi-layer elements are described, for example, U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), U.S. Pat. No. 6,358,669 (Savariar-Hauck et al.), and U.S. Pat. No. 6,528,228 (Savariar-Hauck et al.), U.S. patent application Publication 2004/0067432 A1 (Kitson et al.). U.S. patent application Publication 2005/0037280 (Loccufier et al.) describes heat-sensitive printing plate precursors that comprise a phenolic developer-soluble polymer and an infrared radiation absorbing agent in the same layer.

PROBLEM TO BE SOLVED

Multilayer lithographic printing plates usually include one or more IR-sensitive layers that are removed using an alkaline developer after imaging. Such layers are usually top layers and can be composed of various phenolic resins such as novolac resins, resole resins, and various hydroxy-substituted acrylates as described for example in the publications noted above.

Imageable elements having topcoats comprising cyclic olefin copolymers are described in U.S. Pat. No. 6,969,570 (Kitson). Further, U.S. patent application Publication 2004/0137366 (Kawauchi et al.) describes the use of copolymers comprising pendant carboxy groups or maleic anhydride in top layers of heat-sensitive positive-working elements to improve scratch resistance and development latitude. These copolymers can be developed in relatively "weak" developers that may be considered more environmentally "friendly".

U.S. Pat. No. 6,152,036 (Verschueren et al.) describes the use of hardened epoxy resins in the top layers of positive-working imaging elements. Crosslinking the top layer is said to improve physical and chemical resistance.

There is a desire in the industry to provide positive working imaging elements that have high image resolution (or high discrimination between imaged and non-imaged regions). In addition, there is a need for improved imaging speed and more rapid and complete removal of imaged regions. In many instances, what provides one of these properties worsens others. Moreover, there is a need for imageable elements that can be processed in "cleaner" seasoned developers in which polymeric materials removed during processing are more fully soluble or dispersible in the developing solutions, thereby reducing residue or sediment in the developer tanks and the need for developer filtration.

SUMMARY OF THE INVENTION

This invention provides a positive-working imageable element that is developable with an alkaline developer after thermal imaging, and that comprises a radiation absorbing compound and a substrate having thereon, in order:

an inner layer comprising a first polymeric binder, and an ink receptive outer layer comprising a second polymeric binder different than the first polymeric binder, the second polymeric binder comprising a polymer backbone and an $-X-C(=T)-NR-S(=O)_2-$ moiety that is attached to the polymer backbone, wherein $-X-$ is an oxy or $-NR'-$ group, T is O or S, and R and R' are independently hydrogen, halo, or an alkyl group having 1 to 6 carbon atoms.

This invention also provides a method for forming an image comprising:

A) thermally imaging the positive-working imageable element of the present invention (as described above), thereby forming an imaged element with imaged and non-imaged regions, and B) contacting the imaged element with an alkaline developer to remove only the imaged regions, and C) optionally, baking the imaged and developed element.

This invention additionally comprises imaged elements formed using the method of this invention.

The imageable elements of the present invention contain non-phenolic polymeric binders in the outer layer (topcoat) that are not crosslinked but provide desired shelf life, imaging speed, and image resolution of the resulting imaged elements (for example, printing plates). In addition, we have found that use of the imageable elements of this invention reduces the formation of sludge in the seasoned developer solutions. Therefore less developer filtration and other processor maintenance are required and "weaker" or more environmentally "friendly" developers may be used.

These results are possible because the dissolution rate of the "second" polymeric binder(s) is slow enough to resist developer attack in the non-imaged areas of the outer layer but rapid enough for the second polymeric binder to be quickly loosened from imaged areas and kept suspended or dissolved for a considerable time. The particularly useful second polymeric binders are those containing pendant sulfonamide groups as defined by the —X—C(═T)—NR—S(═O)$_2$— moiety.

DETAILED DESCRIPTION OF THE INVENTION

Definitions

Unless the context indicates otherwise, when used herein, the terms "imageable element", "positive-working imageable element", and "printing plate precursor" are meant to be references to embodiments of the present invention.

In addition, unless the context indicates otherwise, the various components described herein such as "first polymeric binder", "second polymeric binder", "dissolution inhibitor", "added copolymer", "coating solvent", "infrared radiation absorbing compound", "monomeric or polymeric compound comprising a benzoquinone diazide moiety and/or a naphthoquinone diazide moiety", "alkaline developer", and similar terms also refer to mixtures of such components. Thus, the use of the article "a" or "an" is not necessarily meant to refer to only a single component.

Unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287–2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The positive-working imageable elements can be used in a number of ways. The preferred use is as precursors to lithographic printing plates as described in more detail below. However, this is not meant to be the only use of the present invention. For example, the imageable elements can also be used as thermal patterning systems and to form masking elements and printed circuit boards.

Imageable Elements

In general, the imageable element comprises a substrate, an inner layer (also known as an "underlayer"), and an outer layer (also known as a "top layer" or "topcoat") disposed over the inner layer. Before thermal imaging, the outer layer is generally not removable by an alkaline developer within the usual time allotted for development, but after thermal imaging, the imaged regions of the outer layer are more readily removable by or dissolvable in the alkaline developer. The inner layer is also generally removable by the alkaline developer. An infrared radiation absorbing compound (defined below) is also present in the imageable element, and is preferably present in the inner layer but may optionally be in a separate layer between the inner and outer layers.

The imageable elements are formed by suitable application of an inner layer composition onto a suitable substrate. This substrate can be an untreated or uncoated support but it is usually treated or coated in various ways as described below prior to application of the inner layer composition. The substrate generally has a hydrophilic surface or at least a surface that is more hydrophilic than the outer layer composition. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A preferred substrate is composed of an aluminum support that may be treated using techniques known in the art, including physical graining, electrochemical graining, chemical graining, and anodizing. Preferably, the aluminum sheet has been subjected to electrochemical graining and is anodized.

An interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid copolymer, poly(acrylic acid), or acrylic acid copolymer. Preferably, the grained and anodized aluminum support is treated with PVPA using known procedures to improve surface hydrophilicity.

The thickness of the substrate can be varied but should be sufficient to sustain the wear from printing and thin enough to wrap around a printing form. Preferred embodiments include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the various layer compositions applied thereon, and thus be an integral part of the printing press. The use of such imaged cylinders is described for example in U.S. Pat. No. 5,713,287 (Gelbart).

The inner layer is disposed between the outer layer and the substrate. Typically, it is disposed directly on the substrate. The inner layer comprises a polymeric material that is removable by the developer and preferably soluble in the developer to reduce sludging of the developer. In addition, the polymeric material is preferably insoluble in the solvent used to coat the outer layer so that the outer layer can be coated over the inner layer without dissolving the inner layer. This polymeric material is identified herein as the "first polymeric binder" so as to distinguish it from the "second polymeric binder" described below for the outer layer. Mixtures of these first polymeric binders can be used if desired in the inner layer.

Useful first polymeric binders for the inner layer include (meth)acrylonitrile polymers, (meth)acrylic resins comprising carboxy groups, polyvinyl acetals, vinyl acetate crotonate-vinyl neodecanoate copolymer phenolic resins, maleated wood rosins, styrene-maleic anhydride co-polymers, (meth)acrylamide polymers, polymers derived from an N-substituted cyclic imide, and combinations thereof. First polymeric binders that provide resistance both to fountain solution and aggressive washes are disclosed in U.S. Pat. No. 6,294,311 (noted above) that is incorporated herein by reference.

Particularly useful first polymeric binders include (meth) acrylonitrile polymers, and polymers derived from an N-substituted cyclic imide (especially N-phenylmaleimide), a (meth)acrylamide (especially methacrylamide), and a (meth)acrylic acid (especially methacrylic acid). The preferred first polymeric binders of this type are copolymers that comprise from about 20 to about 75 mol % and preferably about 35 to about 60 mol % or recurring units derived from N-phenylmaleimide, N-cyclohexylmaleimide, N-(4-carboxyphenyl)maleimide, N-benzylmaleimide, or a mixture thereof, from about 10 to about 50 mol % and preferably from about 15 to about 40 mol % of recurring units derived from acrylamide, methacrylamide, or a mixture thereof, and from about 5 to about 30 mol % and preferably about 10 to about 30 mol % of recurring units derived from methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid. Optionally, these polymers can also include recurring units derived from (meth)acrylonitrile or N-[2-(2-oxo-1-imidazolidinyl)ethyl]-methacrylamide. These first polymeric binders are soluble in a methyl lactate/methanol/dioxolane (15:42.5:42.5 wt. % ratio) mixture that can be used as the coating solvent for the inner layer. However, they are poorly soluble in solvents such as acetone and 1-methoxy-2-propyl acetate (PMA) that can be used as solvents to coat the outer layer over the inner layer without dissolving the inner layer.

The bakeable inner layers described in WO 2005/018934 (Kitson et al.) and U.S. Pat. No. 6,893,783 (Kitson et al.), the disclosures of which are all incorporated herein by reference, may also be used.

The first polymer binders are the predominant polymeric materials in the inner layer. That is, they comprise more than 50% (dry weight) of the total polymeric materials in the inner layer. However, the inner layer may also comprise one or more primary additional polymeric materials, provided these primary additional polymeric materials do not adversely affect the chemical resistance and solubility properties of the inner layer.

Useful primary additional polymeric materials include copolymers that comprises from about 1 to about 30 mole % and preferably from about 3 to about 20 mole % of recurring units derived from N-phenylmaleimide, from about 1 to about 30 mole % and preferably from about 5 to about 20 mole % of recurring units derived from methacrylamide, from about 20 to about 75 mole % and preferably from about 35 to about 60 mole % of recurring units derived from acrylonitrile, and from about 20 to about 75 mole % and preferably from about 35 to about 60 mole % of recurring units derived from one or more monomers of the structure:

$$CH_2{=}C(R'_3){-}CO_2{-}CH_2CH_2{-}NH{-}CO{-}NH\text{-}p\text{-}C_6H_4{-}R'_2$$

in which $R'_2$ is OH, COOH, or $SO_2NH_2$, and $R'_3$ is H or methyl, and, optionally, from about 1 to about 30 mole % and preferably, when present, from about 3 to about 20 mole % of recurring units derived from one or more monomers of the structure:

$$CH_2{=}C(R'_5){-}CO{-}NH\text{-}p\text{-}C_6H_4{-}R'_4$$

in which $R'_4$ is OH, COOH, or $SO_2NH_2$, and $R'_5$ is H or methyl.

The inner layer may also comprise one or more secondary additional polymeric materials that are resins having activated methylol and/or activated alkylated methylol groups. These "secondary additional polymeric materials" in the inner layer should not be confused as the "second polymeric binder" used in the outer layer.

The secondary additional polymeric materials can include, for example resole resins and their alkylated analogs, methylol melamine resins and their alkylated analogs (for example melamine-formaldehyde resins), methylol glycoluril resins and alkylated analogs (for example, glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical).

The resin having activated methylol and/or activated alkylated methylol groups is preferably a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific) and BKS-5928 resole resin (Union Carbide).

Useful secondary additional polymeric materials can also include copolymers that comprise from about 25 to about 75 mole % and about 35 to about 60 mole % of recurring units derived from N-phenylmaleimide, from about 10 to about 50 mole % and preferably from about 15 to about 40 mole % of recurring units derived from methacrylamide, and from about 5 to about 30 mole % and preferably from about 10 to about 30 mole % of recurring units derived from methacrylic acid. These secondary additional copolymers are disclosed in U.S. Pat. Nos. 6,294,311 and 6,528,228 (both noted above).

The first polymeric binder and the primary and secondary additional polymeric materials useful in the inner layer can be prepared by methods, such as free radical polymerization, that are well known to those skilled in the art and that are described, for example, in Chapters 20 and 21, of *Macromolecules*, Vol. 2, 2nd Ed., H. G. Elias, Plenum, N.Y., 1984. Useful free radical initiators are peroxides such as benzoyl peroxide, hydroperoxides such as cumyl hydroperoxide and azo compounds such as 2,2'-azobis(isobutyronitrile) (AIBN). Suitable reaction solvents include liquids that are inert to the reactants and that will not otherwise adversely affect the reaction.

In preferred embodiments, the inner layer further comprises an infrared radiation absorbing compound ("IR absorbing compounds") that absorbs radiation at from about 600 to about 1200 and preferably at from about 700 to about 1200 nm, with minimal absorption at from about 300 to about 600 nm. This compound (sometimes known as a "photothermal conversion material") absorbs radiation and converts it to heat. Although one of the polymeric materials may itself comprise an IR absorbing moiety, typically the infrared radiation absorbing compound is a separate compound. This compound may be either a dye or pigment such as iron oxides and carbon blacks. Examples of useful pigments are ProJet 900, ProJet 860 and ProJet 830 (all available from the Zeneca Corporation).

Useful IR absorbing compounds also include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

IR absorbing dyes (especially those that are soluble in an alkaline developer) are more preferred to prevent sludging of the developer by insoluble material. Examples of suitable IR dyes include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indoaniline dyes, merostyryl dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in numerous publications including U.S. Pat. No. 6,294,311 (noted above) and U.S. Pat. No. 5,208,135 (Patel et al.) and the references cited thereon, that are incorporated herein by reference.

Examples of useful IR absorbing compounds include ADS-830A and ADS-1064 (American Dye Source, Baie D'Urfe, Quebec, Canada), EC2117 (FEW, Wolfen, Germany), Cyasorb® IR 99 and Cyasorb® IR 165 (GPTGlendale Inc. Lakeland, Fla.), and IR Absorbing Dye A used in the Examples below.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Canada) and FEW Chemicals (Germany). Other useful dyes for near infrared diode laser beams are described, for example, in U.S. Pat. No. 4,973,572 (DeBoer).

In addition to low molecular weight IR-absorbing dyes, IR dye moieties bonded to polymers can be used as well. Moreover, IR dye cations can be used, that is, the cation is the IR absorbing portion of the dye salt that ionically interacts with a polymer comprising carboxy, sulfo, phosphor, or phosphono groups in the side chains.

The radiation absorbing compound can be present in the imageable element in an amount of generally at least 5% and up to 30% and preferably from about 12 to about 25%, based on the total dry weight of the element. Preferably, this amount is based on the total dry weight of the layer in which it is located. The particular amount of a given compound to be used could be readily determined by one skilled in the art.

The inner layer can include other components such as surfactants, dispersing aids, humectants, biocides, viscosity builders, drying agents, defoamers, preservatives, antioxidants, and colorants.

The inner layer generally has a dry coating coverage of from about 0.5 to about 2.5 $g/m^2$ and preferably from about 1 to about 2 $g/m^2$. The first polymeric binders described above generally comprise at least 50 weight % and preferably from about 60 to about 90 weight % based on the total dry layer weight, and this amount can be varied depending upon what other polymers and chemical components are present. Any primary and secondary additional polymeric materials (such as a novolak, resole, or copolymers noted above) can be present in an amount of from about 5 to about 45 weight % and preferably from about 5 to about 25 weight % based on the total dry weight of the inner layer.

The outer layer of the imageable element is disposed over the inner layer and in preferred embodiments there are no intermediate layers between the inner and outer layers. The outer layer comprises a second polymeric material that is different than the first polymeric binder described above. It is generally a light-stable, water-insoluble, alkaline developer soluble, film-forming binder material as defined below. The outer layer is substantially free of infrared radiation absorbing compounds, meaning that none of these compounds are purposely incorporated therein and insubstantial amounts diffuse into it from other layers.

As noted above, it is desired to choose second polymeric binders that are readily loosened from imaged areas and kept dissolved or suspended in the alkaline developer but that remain intact in non-imaged areas. The dissolution rate of the second polymeric binder(s) is slow enough to resist developer attack in the non-imaged areas of the outer layer but rapid enough to loosen the second polymeric binder(s) from the imaged areas of the outer layer.

We have found that this result can best be achieved by using a second polymeric binder in the outer layer that has a pKa of from about 6 to about 9, and preferably from about 6 to about 8. Second polymeric binders having such pKa values can comprise a variety of groups (usually groups pendant to the polymer backbone) that are either directly or indirectly attached to the polymer backbone in sufficient quantity that will provide the desired pKa including, but not limited to, mercapto groups, sulfonamido groups, and N-substituted sulfonamido groups (including but not limited to, alkyl, acyl, alkoxycarbonyl, alkylaminocarbonyl, and β-keto ester substituted sulfonamido groups), α-cyano esters, α-cyano ketones, beta-diketones, and α-nitro esters. The unsubstituted and substituted sulfonamido groups are preferred. The second polymeric binders can also comprise a mixture of the noted pendant groups along the polymer backbone.

It may also be desirable that the pKa of the one or more second polymeric binders be greater than the pKa of the one or more first polymer binder(s) used in the inner layer. In such embodiments, preferably, the pKa difference between the first and second polymeric binders is from about 2 to about 5 units.

More particularly, the outer layer comprises one or more second polymeric binders, each comprising a polymer backbone and an —X—C(=T)—NR—$S(=O)_2$— moiety that is attached to and along the polymer backbone, wherein —X— is an oxy (—O—) or —NR'— group, T is O (forming an oxo group) or S (forming a thioxo group), and R and R' are independently hydrogen, halo, or a substituted or unsubstituted alkyl group having 1 to 6 carbon atoms. Preferably, R is hydrogen, T is O, and X is an oxy or —NH— group.

Any film-forming second polymeric binder containing the requisite groups providing a pKa of from about 6 to about 9 can be used in the outer layer including condensation polymers, acrylic resins, and urethane resins. The pendant groups can be part of the polymerizable monomers or reactive components used to make the polymers, or they can be added after polymerization using known procedures. Preferably, the second polymeric binder comprises one or more acrylic resins that are derived from one or more ethylenically unsaturated polymerizable monomers, at least one of which monomers comprises pendant —X—C(=T)—NR—$S(=O)^2$—$R^3$ groups that are defined below.

The one or more second polymeric binders are generally present in the outer layer in a dry coverage of from about 10 to 100 weight % (preferably from about 50 to 100 weight %) based on total dry weight of the outer layer. Generally these polymeric binders are acrylic homopolymers and copolymers, each comprising recurring units derived from one or more ethylenically unsaturated polymerizable monomers, at least one of which monomers comprises the defined —X—C(=T)—NR—$S(=O)_2$— moiety.

More particularly, the one or more second polymeric binder can be represented by the following Structure (I):

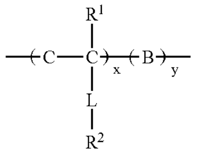

(I)

wherein $R^1$ is hydrogen, a substituted or unsubstituted alkyl group having 1 to 6 carbon atoms (such as methyl, ethyl, chloromethyl, iso-propyl and benzyl), or a halo group (such as fluoro, chloro, or bromo). Preferably, $R^1$ is hydrogen or a substituted or unsubstituted methyl or chloro group, more preferably, it is hydrogen or unsubstituted methyl, and most preferably, it is hydrogen.

$R^2$ represents the —X—C(=T)-NR—$S(=O)_2$—$R^3$ group wherein X, T, and R are as defined above, and $R^3$ is a substituted or unsubstituted aliphatic group or a substituted or unsubstituted aryl group directly attached to —$S(=O)_2$— through a carbon atom. More particularly, $R^3$ can represent a substituted or unsubstituted alkyl group having 1 to 12 carbon atoms, a substituted or unsubstituted cycloalkylene group having 5 to 10 carbon atoms in the ring, a substituted or unsubstituted aryl group having 6 to 10 carbon atoms in the ring, or a substituted or unsubstituted heterocyclyl group, or any combinations of such groups that are linked directly together, or linked together with oxy, carbonyl, amido, thio, or other groups that would be readily apparent to one skilled in the art. Most preferably, $R^3$ is a substituted or unsubstituted phenyl group.

L is a direct bond or a linking group, including but not limited to substituted or unsubstituted alkylene, cycloalkylene, arylene, a divalent heterocyclic, carbonyloxy, thio, oxy, or amido groups, or combinations thereof. The substituted or unsubstituted alkylene groups can have 1 to 6 carbon atoms (such as methylene, 1,2-ethylene, 1,1-ethylene, n-propylene, iso-propylene, t-butylene, n-butylene, and n-hexylene groups), substituted cycloalkylene groups can have 5 to 7 carbon atoms in the cyclic ring (such as cyclopentylene and 1,4-cyclohexylene), the substituted or unsubstituted arylene groups can have 6 to 10 carbon atoms in the aromatic ring (such as 1,4-phenylene, naphthylene, 2-methyl-1,4-phenylene, and 4-chloro-1,3-phenylene groups), and the substituted or unsubstituted, aromatic or non-aromatic divalent heterocyclic groups can have 5 to 10 carbon and one or more heteroatoms (nitrogen, oxygen, or sulfur atoms) in the cyclic ring (such as pyridylene, pyrazylene, pyrimidylene, or thiazolylene groups). Combinations of two or more of these divalent linking groups can be used.

It is particularly desirable that L represent a carboxylic acid ester group such as a substituted or unsubstituted —C(O)O-alkylene, —C(O)O-alkylene-phenylene-, or —C(O)O-phenylene group wherein alkylene has 1 to 4 carbon atoms. More preferably, L is a —C(O)O-alkylene, —C(O)O-alkylene-phenylene-, or —C(O)O-phenylene group and most preferably, it is a —C(O)O-alkylene group wherein the alkylene group has 1 or 2 carbon atoms.

In Structure (I) noted above, B represents recurring units derived from one or more ethylenically unsaturated polymerizable monomers that do not contain an $R^2$ group, including but not limited to, recurring units derived from a (meth)acrylate, (meth)acrylamide, vinyl ether, vinyl ester, vinyl ketone, olefin, unsaturated imide (such as maleimide), N-vinyl pyrrolidone, N-vinyl carbazole, 4-vinyl pyridine, (meth)acrylonitrile, unsaturated anhydride, or styrenic monomer. Preferably, the B recurring units are derived from one or more (meth)acrylates, styrenic monomers, (meth) acrylonitriles, (meth)acrylamides, or combinations thereof.

Mixtures of monomers can be used to provide a mixture of recurring units represented by "B" in Structure (I). For example, a styrenic monomer could be used in combination with methacrylamide, acrylonitrile, maleimide, vinyl acetate, or N-vinyl pyrrolidone, or any combination thereof.

In Structure (I), x is from about 20 to 85 weight %, and y is from about 15 to about 80 weight %. Preferably, x is from about 25 to about 75 weight %, and y is from about 25 to about 75 weight %, and more preferably x is from about 30 to 70 weight % and y is from about 30 to about 70 weight %.

Examples of useful monomers containing $R^2$ groups that are useful for preparing second polymeric binders are the following ethylenically unsaturated polymerizable monomers A-1 through A-6, with A-1 being the most preferred monomer:

(A-1)

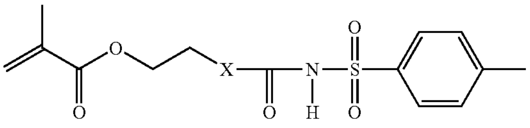

wherein X is as defined above, (A-2)

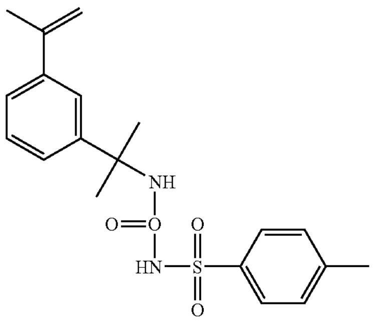

(A-3)

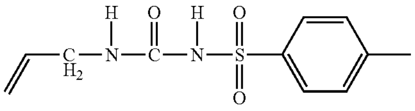

(A-4)

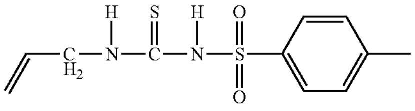

(A-5)

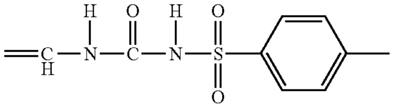

(A-6)

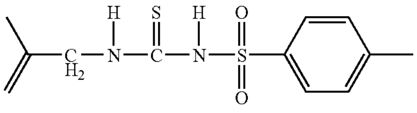

The second polymeric binders can be prepared by conventional condensation or addition polymerization methods depending upon the type of polymer to be used. The starting materials and reaction conditions would be readily apparent to one skilled in the polymer chemistry art. Representative synthetic methods are provided below before the Examples.

The outer layer can optionally include colorants. Particularly useful colorants are described for example in U.S. Pat. No. 6,294,311 (noted above) including triarylmethane dyes such as ethyl violet, crystal violet, malachite green, brilliant green, Victoria blue B, Victoria blue R, and Victoria pure blue BO. These compounds can act as contrast dyes that distinguish the unimaged areas from the imaged areas in the developed imageable element.

When a colorant is present in the outer layer, its amount can vary widely, but generally it is present in an amount of at least 0.1 weight % and up to 30 weight %, and preferably from about 0.2 to about 5 weight %, based on the total dry weight of the outer layer.

The outer layer can optionally also include contrast dyes, printout dyes, coating surfactants, dispersing aids, humectants, biocides, viscosity builders, drying agents, defoamers, preservatives, and antioxidants. Coating surfactants are particularly useful.

The outer layer generally has a dry coating coverage of from about 0.2 to about 1 g/m$^2$ and preferably from about 0.4 to about 0.7 g/m$^2$.

Although not preferred, there may be a separate layer that is in between and in contact with the inner and outer layers. This separate layer can act as a barrier to minimize migration of radiation absorbing compound(s) from the inner layer to the outer layer. This separate "barrier" layer generally comprises a third polymeric binder that is soluble in the alkaline developer. If this third polymeric binder is different from the first polymeric binder(s) in the inner layer, it is preferably soluble in at least one organic solvent in which the inner layer first polymeric binders are insoluble. A preferred third polymeric binder is a poly(vinyl alcohol). Generally, this barrier layer should be less than one-fifth as thick as the inner layer, and preferably less than one-tenth as thick as the inner layer.

Preparation of the Imageable Element

The imageable element can be prepared by sequentially applying an inner layer formulation over the surface of the substrate (and any other hydrophilic layers provided thereon), and then applying an outer layer formulation over the inner layer using conventional coating or lamination methods. It is important to avoid intermixing of the inner and outer layer formulations.

The inner and outer layers can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder).

The selection of solvents used to coat both the inner and outer layers depends upon the nature of the first and second polymeric binders, other polymeric materials, and other components in the formulations. To prevent the inner and outer layer formulations from mixing or the inner layer from dissolving when the outer layer formulation is applied, the outer layer formulation should be coated from a solvent in which the first polymeric binder(s) of the inner layer are insoluble. Generally, the inner layer formulation is coated out of a solvent mixture of methyl ethyl ketone (MEK), methyl lactate, γ-butyrolactone (BLO), and water, a mixture of diethyl ketone (DEK), water, methyl lactate, and BLO, a mixture of DEK, water, and methyl lactate, or a mixture of methyl lactate, methanol, and dioxolane. The outer layer formulation is generally coated out of DEK, a mixture of DEK and 1-methoxy-2-propyl acetate (PMA), or a mixture of MEK and PMA.

Alternatively, the inner and outer layers may be applied by conventional extrusion coating methods from melt mixtures of the respective layer compositions. Typically, such melt mixtures contain no volatile organic solvents.

Intermediate drying steps may be used between applications of the various layer formulations to remove solvent(s)

before coating other formulations. Drying steps may also help in preventing the mixing of the various layers.

Representative methods for preparing imageable elements of this invention are shown in Examples 1–6 below.

The imageable elements can have any useful form including, but not limited to, printing plate precursors, printing cylinders, printing sleeves and printing tapes (including flexible printing webs). Preferably, the imageable members are printing plate precursors useful for providing lithographic printing plates.

Printing plate precursors can be of any useful size and shape (for example, square or rectangular) having the requisite inner and outer layers disposed on a suitable substrate. Printing cylinders and sleeves are known as rotary printing members having the substrate and inner and outer layers in a cylindrical form. Hollow or solid metal cores can be used as substrates for printing sleeves.

Imaging and Development

During use, the imageable element is exposed to a suitable source of infrared using an infrared laser at a wavelength of from about 600 to about 1200 nm and preferably from about 700 to about 1200 nm. The lasers used to expose the imageable elements are preferably diode lasers, because of the reliability and low maintenance of diode laser systems, but other lasers such as gas or solid state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1040 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. Examples of useful imaging apparatus are available as models of Creo Trendsetter® imagesetters available from Creo Corporation (a subsidiary of Eastman Kodak Company, Burnaby, British Columbia, Canada) that contain laser diodes that emit near infrared radiation at a wavelength of about 830 nm. Other suitable imaging sources include the Gerber Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging speeds may be in the range of from about 50 to about 1500 $mJ/cm^2$, and more particularly from about 75 to about 400 $mJ/cm^2$.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", as described for example in U.S. Pat. No. 5,488,025 (Martin et al.) and as used in thermal fax machines and sublimation printers. Thermal print heads are commercially available (for example, a Fujitsu Thermal Head FTP-040 MCS001 and TDK Thermal Head F415 HH7-1089).

Imaging is generally carried out by direct digital imaging. The image signals are stored as a bitmap data file on a computer. Such files may be generated by a raster image processor (RIP) or other suitable means. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with a suitable alkaline developer removes the exposed regions of the outer layer and the underlying layers (including the inner layer), and exposes the hydrophilic surface of the substrate. Thus, the imageable elements of this invention are "positive-working". The exposed (or imaged) regions of the hydrophilic surface repel ink while the non-exposed (or non-imaged) regions of the outer layer accept ink.

More particularly, development is carried out for a time sufficient to remove the imaged (exposed) regions of the outer layer and underlying layers, but not long enough to remove the non-imaged (non-exposed) regions of the outer layer. Thus, the imaged (exposed) regions of the outer layer are described as being "soluble" or "removable" in the alkaline developer because they are removed, dissolved, or dispersed within the alkaline developer more readily than the non-imaged (non-exposed) regions of the outer layer. Thus, the term "soluble" also means "dispersible". Because of the nature of the second polymer binder(s) used in the outer layer, removal of the exposed regions readily occurs during development but the removed portions of the outer layer stay suspended or soluble in the developer solution for a longer period of time.

The imaged elements are generally developed using conventional processing conditions. Both aqueous alkaline developers and solvent-based alkaline developers can be used with the latter type of alkaline developers being preferred.

Aqueous alkaline developers generally have a pH of at least 7 and preferably of at least 11. Useful alkaline aqueous developers include 3000 Developer, 9000 Developer, GOLDSTAR Developer, GREENSTAR Developer, ThermalPro Developer, PROTHERM Developer, MX1813 Developer, and MX1710 Developer (all available from Kodak Polychrome Graphics, a subsidiary of Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates).

Solvent-based alkaline developers are generally single-phase solutions of one or more organic solvents that are miscible with water. Useful organic solvents can contain the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, or ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight. It is particularly desirable that the alkaline developer contains one or more thiosulfate salts or amino compounds that include at least one N-hydrogen atom and an alkyl group that is substituted with a hydrophilic group such as a hydroxy group, polyethylene oxide chain, or an acidic group having a pKa less than 7 (more preferably less than 5) or their corresponding salts (such as carboxy, sulfo, sulfonate, sulfate, phosphonic acid, and phosphate groups). Particularly useful amino compounds of this type include, but are not limited to, monoethanolamine, diethanolamine, glycine, alanine, aminoethylsulfonic acid and its salts, aminopropylsulfonic acid and its salts, and Jeffamine compounds (for example, an amino-terminated polyethylene oxide).

Representative solvent-based alkaline developers include ND-1 Developer, 955 Developer and 956 Developer (available from Kodak Polychrome Graphics, a subsidiary of Eastman Kodak Company), and the TSD-01 Developer described below. The TSD-01 and ND-1 Developers are particularly useful.

Generally, the alkaline developer is applied to the imaged element by rubbing or wiping the outer layer with an applicator containing the developer. Alternatively, the imaged element can be brushed with the developer or the developer may be applied by spraying the outer layer with sufficient force to remove the exposed regions. The imaged element is preferably immersed in the developer. In all instances, a developed image is produced, particularly in a lithographic printing plate, having excellent resistance to press room chemicals.

Following development, the imaged element can be rinsed with water and dried in a suitable fashion. The dried element can also be treated with a conventional gumming solution (preferably gum arabic).

The imaged and developed element can also be baked in a postbake operation that can be carried out to increase run length of the resulting imaged element. Baking can be carried out, for example at from about 220° C. to about 240° C. for from about 7 to about 10 minutes, or at about 120° C. for 30 minutes.

A lithographic ink and fountain solution can be applied to the printing surface of the imaged element for printing. The ink is taken up by the non-imaged (non-exposed or non-removed) regions of the outer layer and the fountain solution is taken up by the hydrophilic surface of the substrate revealed by the imaging and development process. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following examples are provided to illustrate the practice of the invention but are by no means intended to limit the invention in any manner.

EXAMPLES

The components and materials used in the examples and analytical methods were as follows:

MEK is methyl ethyl ketone.

DEK is diethyl ketone.

PGME is 1-methoxypropan-2-ol. It is also known as Dowanol PM.

BLO is γ-butyrolactone.

PMA is 1-methoxy-2-propyl acetate.

IR dye A is Kayasorb PS210CnE, an infrared absorbing dye as supplied by Nippon Kayaku Co, Ltd. (Tokyo, Japan).

IR absorbing Dye B was obtained from Eastman Kodak Company and is represented by the following formula:

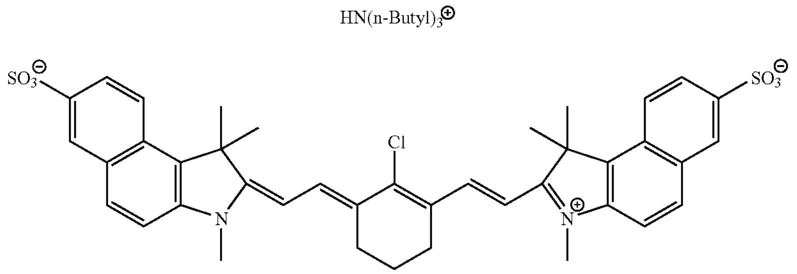

IR Dye B

JK69 is a copolymer having recurring units derived from N-phenylmaleimide (40 mol %), methacrylamide (35 mol %), and methacrylic acid (25 mol %).

JK58 is a copolymer having recurring units derived from N-phenylmaleimide (50 mol %), methacrylamide (35 mol %), and methacrylic acid (15 mol %).

Ethyl violet is C.I. 42600 (CAS 2390-59-2, $\lambda_{max}$=596 nm) having a formula of (p-$(CH_3CH_2)_2NC_6H_4)_3C^+Cl^-$ (Aldrich Chemical Company, Milwaukee, Wis., USA).

TSD01 is a developing solution ("developer") formulated with water (726.39 g), monoethanolamine (6.64 g), diethanolamine (99%, 34.44 g), Pelex NBL (35%, 177.17 g), and benzyl alcohol (55.36 g). Pelex NBL is available from the Kao Corporation (Tokyo, Japan).

Byk® 307 is a polyethoxylated dimethylpolysiloxane copolymer that is available from Byk Chemie (Wallingford, Conn.) in a 25 wt. % xylene/-methoxypropyl acetate solution.

Substrate A is a 0.3 mm gauge aluminum sheet that had been electro-grained, anodized, and subjected to treatment poly(vinyl phosphonic acid).

ND-1 is a solvent-based developer available from Kodak Polychrome Graphics (Norwalk, Conn., USA, a subsidiary of Eastman Kodak Company).

The following sulfoamide-containing polymers were prepared and used in the Examples below:

Synthesis of Polymer A:

Formation of Intermediate I:

Dimethylacetamide (246.6 g), 2-hydroxy ethyl methacrylate (65 g), and dibutyl tin dilaurate (0.42 g) were charged into a 500 ml 4-neck ground glass flask, equipped with a heating mantle, temperature controller, mechanical stirrer, condenser, pressure equalized addition funnel, and nitrogen inlet. The reaction mixture was heated to 60° C. under nitrogen atmosphere. Then p-toluene sulfonyl isocyanate (TSI, 98.6 g) was added at 60° C. over a period of one hour. The reaction was completed in six hours. The completion of reaction was determined by the disappearance of isocyanate infrared absorption band at 2275 $cm^{-1}$. At the end of the reaction, methanol (5 g) was added. The resulting Intermediate I had an acid number of 163.6 was used for the preparation of Polymers A and B.

Preparation of Final Product:

Dimethylacetamide (139.2 g), Intermediate I (23.75 g), methyl methacrylate (MMA, 9.5 g), and 2,2'-azobis(2-methylpropionitrile) (0.19 g) [Vazo-64, from Dupont de Nemours Co] were added in 500 ml 4-neck ground glass flask, equipped with a heating mantle, temperature controller, mechanical stirrer, condenser, pressure equalized addition funnel, and nitrogen inlet. The reaction mixture was heated to 80° C. under nitrogen atmosphere. Then a pre-mixture containing Intermediate I (70 g), methyl methacrylate (36 g), and 2,2'-azobis(2-methylpropionitrile) (0.38 g) was added over two hours at 80° C. The reaction was continued another 12 hours and extra Vazo-64 (0.45 g) was added in increments. The conversion to Polymer A was >95% based on the determination of percent of non-volatiles. The viscosity was (G.H'33) A-+ (~50 cps). The ratio of urethane adduct to methyl methacrylate in Intermediate I was 45:55 by weight. The resulting Polymer A was isolated in powder form using water/ice and had acid number 40.0.

Synthesis of Polymer B:

Polymer B was prepared using the same procedure used for making Polymer A except the ratio of urethane adduct (Intermediate I) to methyl methacrylate was 70:30 by weight. The resulting Polymer B was isolated in powder form using water/ice and had acid number 72.0.

Synthesis of Polymer C:

Preparation of Intermediate II:

Diethyl ketone (DEK, 122.5 g), 2-hydroxy ethyl methacrylate (32.5 g), and dibutyl tin dilaurate (0.2 g) were charged into 500 ml 4-neck ground glass flask, equipped with a heating mantle, temperature controller, mechanical stirrer, condenser, pressure equalized addition funnel, and nitrogen inlet. The reaction mixture was heated to 60° C. under nitrogen atmosphere. Then p-toluene sulfonyl isocyanate (48.3 g) was added at 60° C. over a period of one hour. The reaction was completed in four hours as determined by the disappearance of isocyanate infrared absorption band at 2275 $cm^{-1}$. The resulting Intermediate II had an acid number of 163.4.

Preparation of Final Product:

Diethyl ketone (78.6 g), Intermediate II (18 g), methyl methacrylate (12.6 g), and 2,2'-azobis(2-methylpropionitrile) (0.2 g, Vazo-64 from Dupont de Nemours Co) were added to a 500 ml 4-neck ground glass flask, equipped with a heating mantle, temperature controller, mechanical stirrer, condenser, pressure equalized addition funnel, and nitrogen inlet. The reaction mixture was heated to 80° C. under nitrogen atmosphere. Then pre-mixture of Intermediate II (53 g), methyl methacrylate (39 g), and 2,2'-azobis(2-methylpropionitrile (0.4 g) were added in two hours at 80° C. Reaction was continued another eight hours while extra Vazo 64 (0.45 g) was added in increments. The polymer conversion was >99% based on a determination of the percent of non-volatiles. The viscosity (G.H'33) was D+ (~105 cps). The ratio of Intermediate II to methyl methacrylate was 35.5:64.5 by weight. The resulting Polymer C was in solution and had an acid number of 54.0.

Synthesis of Polymer D:

Polymer D was prepared using the procedure used to prepare Polymer C except the ratio of Intermediate II and methyl methacrylate was 42:58 by weight. The resulting Polymer D was in solution and had an acid number of 71.0.

Synthesis of Polymer E:

Preparation of Intermediate III:

N-N-Dimethylformamide (203.0 g), p-toluene sulfonamide (69.86 g), and $CuCl_2 2H_2O$ (3.41 g) were charged into a 1000 ml 4-neck ground glass flask, equipped with a heating mantle, temperature controller, mechanical stirrer, condenser, pressure equalized addition funnel, and nitrogen inlet. Isocyanato ethyl methyl acrylate (62.06 g) was added under nitrogen atmosphere at room temperature over a period of one hour and the reaction mixture was exothermed to 34° C. The reaction mixture was then heated to 40° C. and the reaction was completed in four hours. Completion of reaction was determined by the disappearance of isocyanate infrared absorption band at 2275 $cm^{-1}$. At the end of the reaction, methanol (13 g) was added. The resulting Intermediate III was isolated in powder form using water/ice and the powder was re-dissolved in water until the blue color disappeared. Intermediate III had an acid number of 174.5.

Preparation of Final Product:

Dimethylacetamide (75.8 g), Intermediate III (18.0 g), and methyl methacrylate (32.0 g) were added in 500 ml 4-neck ground glass flask, equipped with a heating mantle, temperature controller, mechanical stirrer, condenser, pressure equalized addition funnel, and nitrogen inlet. Nitrogen was passed through the solution for 30 minutes. Then the reaction mixture was covered in a nitrogen atmosphere and heated to 80° C. while Vazo-64 (0.30 g) was added. The reaction was continued another three hours. Polymer E conversion was >98% based on a determination of percent of non-volatiles. The viscosity was (G.H'33) $Z_{2-}$ (~3390 cps). The ratio of Intermediate III to methyl methacrylate was 36:64 by weight. The resulting Polymer E was isolated in powder form using water/ice and a lab dispersator (Model #84, Series 2000) at 4000 rpm. Isolated Polymer E was dried in oven at 110° F. (43.3° C.) and had an acid number of 64.0.

Examples 1-3

Imageable elements of this invention were prepared using the following inner and outer layer formulations:

Inner layer formulations were prepared with the components described in TABLE I below and applied to Substrate A using a 0.012 inch (0.03 cm) wire-wound bar and dried for 30 seconds at 135° C. to provide a dry coated film of approximately 1.5 $g/cm^2$.

Topcoat (outer layer) solutions were prepared with the components described in TABLE II below and applied with a 0.006 inch (0.015 cm) wire-wound bar and dried at 30 seconds at 135° C. to provide a dry coat weight of approximately 0.6 $g/cm^2$ for Examples 1 and 2, and about 0.5 $g/cm^2$ for Example 3.

TABLE I

| | JK69 | IR Dye A | IR Dye B | Byk ®-307 | Solvent* |
|---|---|---|---|---|---|
| Inner Layer | 5.69 | 0.7 | 0.56 | 0.46 | 92.59 |

*MEK/methyl lactate/BLO/water at a weight ratio of 50:30:10:10

TABLE II

| Example | Polymer A | Polymer B | Polymer C (40% solids in DEK) | Polymer D (40% solids in DEK) | Ethyl violet | Byk ®-307 | Solvent* |
|---|---|---|---|---|---|---|---|
| 1 | 0.585 | 0.9 | 0 | 0 | 0.3 | 0.12 | 23.095 |
| 2 | 0 | 0.6 | 2.212 | 0 | 0.3 | 0.12 | 21.768 |
| 3 | 0 | 0 | 0 | 3.093 | 0.3 | 0.12 | 21.487 |

*DEK/PMA at a 92:8 weight ratio

The imageable elements were then subjected to the following tests:

Developer Solubility:

Drops of a developer solution of water and TSD01 (5:1 v/v) were applied to the each element at 10-second intervals for 120 seconds. The developer solution was washed off immediately with water. The time required for surface (upper layer) deterioration to begin (in seconds) was recorded.

Imaging Tests

Each element was imaged using a commercially available Screen PlateRite 4300 series platesetter. A C1 2400 Dpi internal test pattern was applied at a drum speed of 1000 rpm using exposures of 50%, 55%, 60%, 65%, 70%, 75%, 80%, 85%, & 90% power. The resulting imaged printing plates were processed in a Kodak Polychrome Graphics PK910II processor containing a developer solution of water and TSD01 (5:1 v/v) at 30° C. for 12 seconds. The developed plates were then evaluated for cleanout (that is, the minimum exposure necessary to produce a clean image) and best exposure (that is, the exposure that produces the best image quality).

All of the elements had upper layers that exhibited good resistance to the developer solution and that produced high quality images after exposure and development. The detailed results are provided below in TABLE III.

TABLE III

| Example | Developer Test | Cleanout Energy | Best Exposure | Comments |
|---|---|---|---|---|
| 1 | 120 | 55% | 65% | Good image, high resolution, easy processing |
| 2 | 120 | 60% | 65% | Good image, high resolution, easy processing |
| 3 | 60 | 60% | 65% | Good image, high resolution, easy processing |

Examples 4–6

Imageable elements of this invention were prepared using the following inner and outer layer formulations:

Inner layer formulations were prepared with the components described in TABLE IV below and applied to Substrate A using a 0.012 inch (0.03 cm) wire-wound bar and dried for 30 seconds at 135° C. to provide a dry coated film of approximately 1.5 g/cm$^2$.

Topcoat (outer layer) solutions were prepared with the components described in TABLE V below and applied with a 0.006 inch (0.015 cm) wire-wound bar and dried at 30 seconds at 135° C. to provide a dry coat weight of approximately 0.6 g/cm$^2$.

TABLE IV

| | JK58 | IR Dye A | IR Dye B | Byk ®-307 | Solvent* |
|---|---|---|---|---|---|
| Inner Layer | 5.69 | 0.7 | 0.56 | 0.46 | 92.59 |

*MEK/methyl lactate/BLO/water at a weight ratio of 50:30:10:10

TABLE V

| Example | Polymer A | Polymer C (40% solids in DEK) | Polymer E | Ethyl violet | Byk®-307 | Solvent* |
|---|---|---|---|---|---|---|
| 4 | 0 | 3.712 | 0 | 0.3 | 0.12 | 20.868 |
| 5 | 1.485 | 0 | 0 | 0.3 | 0.12 | 23.095 |
| 6 | 0 | 0 | 1.485 | 0.3 | 0.12 | 23.095 |

*DEK/PMA at a weight ratio of 92:8

The imageable elements were then subjected to the following tests:

Developer Solubility:

Drops of a developer solution of water and ND1 developer (4:1 v/v) were applied to the each element at 10-second intervals for 120 seconds. The developer solution was washed off immediately with water. The time required for surface (upper layer) deterioration to begin (in seconds) was recorded.

Imaging Tests:

Each element was imaged using a commercially available Screen PlateRite 4300 series platesetter. A C1 2400 Dpi internal test pattern was applied at a drum speed of 1000 rpm using exposures of 50%, 55%, 60%, 65%, 70%, 75%, 80%, 85%, & 90% power. The resulting imaged printing plates were processed in a Kodak Polychrome Graphics PK910II processor containing a developer solution of water and ND1 developer (4:1 v/v) at 30° C. for 12 seconds. The developed plates were then evaluated for cleanout (that is, the minimum exposure necessary to produce a clean image) and best exposure (that is, the exposure that produces the best image quality).

All of the elements had upper layers that exhibited good resistance to the developer solution and that produced high quality images after exposure and development. The detailed results are provided below in TABLE VI.

TABLE VI

| Example | Developer Test | Cleanout Energy | Best Exposure | Comments |
|---|---|---|---|---|
| 4 | 40 | 75% | 85% | Good image, high resolution, easy processing |
| 5 | 40 | 65% | 75% | Good image, high resolution, easy processing |
| 6 | 60 | 75% | 85% | Good image, high resolution, easy processing |

Several upper layer formulations were prepared within the scope of this invention and tested for solubility in developer solutions.

Polymers A, B, and E (0.1 g) were individually dissolved in a mixture (9.9 g) of water and TSD01 (5:1 v/v) and stirred for 24 hours. The solutions were then inspected for insoluble material. We found that all polymers were fully dissolved in the developer/water mixture.

Similarly, Polymers A, B, and E (0.1 g) were individually dissolved in a mixture (9.9 g) of water and ND1 developer (4:1 v/v) and stirred for 24 hours. No insoluble material was observed in any of the solutions.

The foregoing results indicate that the polymers designed for the present invention not only provide excellent images and resistance to developing chemicals, but they are also fully dissolved within the developer solutions. Thus, filtration of the developer is not required after use to process the imaged elements and solid residue in the developer tanks is reduced or eliminated.

The invention has been described in detail with particular reference to certain preferred embodiments thereof, but it will be understood that variations and modifications can be effected within the spirit and scope of the invention.

The invention claimed is:

1. A positive-working imageable element that comprises a radiation absorbing compound and a substrate having thereon, in order:

an inner layer comprising a first polymeric binder, and an ink receptive outer layer comprising a second polymeric binder different than said first polymeric binder, said polymeric binder comprising a hydrophobic backbone, wherein said second polymeric binder has a pKa of from about 6 to about 9, and the pKa of said second polymeric binder is greater than the pKa of said first polymeric binder.

2. The element of claim 1 wherein said second polymeric binder has a pKa of from about 6 to about 8.

3. The element of claim 1 wherein the difference in pKa values between said first and second polymeric binders is from about 2 to about 5 units.

4. The element of claim 1 wherein said second polymeric binder comprises one or more mercapto, sulfonamido, N-substituted sulfonamido, α-cyano esters, α-cyano ketones, β-diketones, and α-nitro ester groups, or mixtures thereof, in sufficient amounts to provide said second polymeric binder pKa value.

5. The element of claim 4 wherein said mercapto, sulfonamido, N-substituted sulfonamido, α-cyano esters, α-cyano ketones, β-diketones, and α-nitro ester groups, or mixtures thereof, are present as pendant groups on said hydrophobic backbone.

6. The element of claim 1 wherein said second polymeric binder also comprises recurring units derived from a (meth) acrylate, (meth)acrylamide, vinyl ether, vinyl ester, vinyl ketone, olefin, unsaturated imide, unsaturated anhydride, N-vinyl pyrrolidone, N-vinyl carbazole, 4-vinyl pyridine, (meth)acrylonitrile, styrenic monomer, or combinations thereof.

7. The element of claim 6 wherein said second polymeric binder comprises recurring units derived from one or more (meth)acrylates, styrenic monomers, (meth)acrylonitriles, (meth)acrylamides, or combinations thereof.

8. The element of claim 1 wherein said infrared radiation absorbing compound is a carbon black or IR absorbing dye having a maximum absorption at from about 700 to about 1200 nm and is present in said inner layer in an amount of at least 5 weight %.

9. The element of claim 1 wherein said outer layer further comprises a colorant, a coating surfactant, or both.

10. The element of claim 1 wherein said first polymeric binder is a (meth)acrylic resin comprising carboxy groups, a vinyl acetate-crotonate-vinyl neodecanoate copolymer phenolic resin, a maleated wood rosin, a styrene-maleic anhydride copolymer, a (meth)acrylamide polymer, a (meth) acrylonitrile polymer, or a polymer derived from an N-substituted cyclic imide.

11. The element of claim 1 wherein said first polymeric binder is a copolymer derived from an N-substituted cyclic imide, a (meth)acrylonitrile, a (meth)acrylamide, and (meth) acrylic acid.

12. The element of claim 11 wherein said inner layer further comprises a secondary additional polymeric material.

13. The element of claim 1 wherein said inner layer has a dry coating weight of from about 0.5 to about 2.5 $g/m^2$ and said outer layer has a dry coating weight of from about 0.2 to about 1 $g/m^2$.

14. A method for forming an image comprising:

A) thermally imaging the positive-working imageable element of claim 1, thereby forming an imaged element with imaged and non-imaged regions, B) contacting said imaged element with an alkaline developer to remove only said imaged regions, and C) optionally, baking said imaged and developed element.

15. The method of claim 14 wherein imaging in step A is carried out using infrared radiation in the range of from about 700 nm to about 1200 nm.

16. The method of claim 14 wherein said alkaline developer is a solvent-based developer containing benzyl alcohol or ethylene glycol phenyl ether (phenoxy ethanol).

17. The method of claim 14 wherein said second polymeric binder has a pKa of from about 6 to about 8, and the difference in pKa values between said first and second polymeric binders is from about 2 to about 5 units.

18. The method of claim 14 wherein said second polymeric binder comprises one or more mercapto, sulfonamido, N-substituted sulfonamido, α-cyano esters, α-cyano ketones, β-diketones, and α-nitro ester groups, or mixtures thereof, in sufficient amounts to provide said second polymeric binder pKa value, and said groups are present as pendant groups on said hydrophobic backbone.

19. The method of claim 14 wherein said second polymeric binder also comprises recurring units derived from a (meth)acrylate, (meth)acrylamide, vinyl ether, vinyl ester, vinyl ketone, olefin, unsaturated imide, unsaturated anhydride, N-vinyl pyrrolidone, N-vinyl carbazole, 4-vinyl pyridine, (meth)acrylonitrile, styrenic monomer, or combinations thereof.

* * * * *